(12) United States Patent
Takashima

(10) Patent No.: US 7,768,120 B2
(45) Date of Patent: Aug. 3, 2010

(54) HEAT SPREADER AND SEMICONDUCTOR DEVICE USING THE SAME

(75) Inventor: Kouichi Takashima, Hyogo (JP)

(73) Assignee: A.L.M.T. Corp., Tokyo (JP)

( * ) Notice: Subject to any disclaimer, the term of this patent is extended or adjusted under 35 U.S.C. 154(b) by 415 days.

(21) Appl. No.: 12/005,312

(22) Filed: Dec. 27, 2007

(65) Prior Publication Data

US 2008/0157347 A1 Jul. 3, 2008

(30) Foreign Application Priority Data

Dec. 28, 2006 (JP) .............................. 2006-355731

(51) Int. Cl.
H01L 23/34 (2006.01)
H01L 23/10 (2006.01)

(52) U.S. Cl. .............................. 257/706; 257/E23.101; 257/707; 257/712; 438/122

(58) Field of Classification Search .......... 257/E33.075, 257/E31.131, E23.101, E23.112, 706, 707, 257/712, 713, 718, 719; 438/122, FOR. 413
See application file for complete search history.

(56) References Cited

U.S. PATENT DOCUMENTS

| | | | | |
|---|---|---|---|---|
| 5,260,106 | A * | 11/1993 | Kawarada et al. | 427/577 |
| 5,616,888 | A * | 4/1997 | McLaughlin et al. | 174/260 |
| 5,976,909 | A * | 11/1999 | Shiomi et al. | 438/105 |
| 6,310,775 | B1 * | 10/2001 | Nagatomo et al. | 361/707 |
| 6,579,623 | B2 * | 6/2003 | Kurihara et al. | 428/556 |
| 6,593,643 | B1 * | 7/2003 | Seki et al. | 257/677 |
| 6,753,093 | B2 * | 6/2004 | Tanaka et al. | 428/615 |
| 7,528,413 | B2 * | 5/2009 | Yoshida et al. | 257/77 |
| 7,569,929 | B2 * | 8/2009 | Mori et al. | 257/706 |
| 2002/0063329 | A1 | 5/2002 | Horie et al. | 257/706 |
| 2003/0025193 | A1 | 2/2003 | Ozawa | 257/701 |
| 2004/0238829 | A1 | 12/2004 | Kurita et al. | 257/79 |
| 2005/0230819 | A1 | 10/2005 | Takashima et al. | |

FOREIGN PATENT DOCUMENTS

| | | |
|---|---|---|
| AE | 2001-298237 | 10/2001 |
| EP | 1 422 757 A1 | 5/2004 |
| JP | 05-243690 | 9/1993 |
| JP | 06-350202 | 12/1994 |
| JP | 08-330672 | 12/1996 |
| JP | 2003-046181 | 2/2003 |
| JP | 2003-152145 A | 5/2003 |

\* cited by examiner

*Primary Examiner*—Chris Chu
(74) *Attorney, Agent, or Firm*—Rabin & Berdo, PC

(57) ABSTRACT

The present invention provides a heat spreader 1 which includes a substrate 7 composed of a metal-containing material and in which a second-component connection surface 6 of the substrate 7 is provided with wettability with a solder and a solder block layer 14 is formed in at least one of respective regions, adjacent to each other, of the second-component connection surface 6 and a side surface 13. When a semiconductor device 4 is manufactured by connecting a semiconductor laser 2 to the element connection surface 5 through an element connecting layer 8, and then connecting a heat sink 3 to the second-component connection surface 6 through a second-component connecting layer 9 having a melting point lower than that of the element connecting layer 8, the semiconductor block layer 14 can inhibit the melted solder from creeping up along the side surface 13, which can prevent defects that the solder that has crept up short-circuits the semiconductor laser 2 and blocks a luminous flux of laser light emitted from an emission surface 12 of the semiconductor laser 2.

16 Claims, 6 Drawing Sheets

HEAT SPREADER AND SEMICONDUCTOR DEVICE USING THE SAME

BACKGROUND OF THE INVENTION

1. Field of the Invention

The present invention relates particularly to a heat spreader that can be suitably used for transferring heat from a semiconductor element required of high heat transfer characteristics, for example, a high-power semiconductor laser for laser beam machining, and to a semiconductor device using the heat spreader.

2. Description of Related Art

In order to transfer heat generated when semiconductor elements, represented by, semiconductor light emitting elements such as semiconductor lasers and light emitting diodes, operate outward from the elements, and more specifically into environments or the like through second-components such as heat sinks or stems, as heat spreaders such as sub-mounts, heat sinks or heat transferring substrates that are interposed between the semiconductor elements and the second-components, ones composed of Si, ceramics, etc. have been conventionally widely used. The reason for this is that the heat spreaders composed of Si, ceramics, etc., are easy to process, for example, to cut, are easy to perform pattern-forming for wiring to the semiconductor elements, and can keep manufacturing costs low (see, for example, Japanese Unexamined Patent Publication Nos. JP 06-350202 A (1994) and JP 2003-46181 A).

FIG. 15 is a sectional view showing an example of a conventional semiconductor device 4, configured by connecting a semiconductor laser 2 serving as a semiconductor element and a heat sink 3 serving as a second-component to a sub-mount 1 serving as the above-mentioned conventional heat spreader, for transferring heat generated when the semiconductor laser 2 operates to the heat sink 3 through the sub-mount 1 to transfer the heat into an environment. Referring to FIG. 15, the sub-mount 1 in the semiconductor device 4 in this example includes a plate shaped substrate 7 made of Si or ceramics as described above, and in which an upper surface and a lower surface of the plate respectively serve as an element connection surface 5 for connection of the semiconductor laser 2 and a second-component connection surface 6 for connection of the heat sink 3.

Furthermore, a region, to which the semiconductor laser 2 is connected, of the element connection surface 5 of the substrate 7 is coated with an element connecting layer 8 composed of a solder, and the second-component connection surface 6 is coated with a second-component connecting layer 9 composed of a solder having a melting point lower than that of the solder forming the element connecting layer 8. Further, the element connection surface 5 of the substrate 7 may, in some cases, be coated with a metal layer such as an Au layer, which is not illustrated, by sputtering, vacuum deposition, wet plating, or the like prior to coating the element connecting layer 8 in order to provide the element connection surface 5 with good wettability with the solder forming the element containing layer 8.

The semiconductor laser 2 is formed by laminating a plurality of semiconductor layers, electrode layers, or the like in a vertical direction, and its side surface crossing the direction of the lamination serves as an emission surface 12 for emitting laser light 11 generated in an active layer 10 provided halfway in the direction of the lamination. The heat sink 3 releases heat generated when the semiconductor laser 2 operates and transferred through the element connecting layer 8, the sub-mount 1 and the second-component connecting layer 9 into an environment or further transfers the heat to a third-component, and is generally formed of Cu or the like.

The semiconductor device 4 in the example illustrated in FIG. 15 is manufactured in the following procedure, for example. That is, the sub-mount 1 and the semiconductor laser 2 are connected to each other by heating the sub-mount 1 and the semiconductor laser 2 in a laminated state with the element connecting layer 8 sandwiched therebetween to melt the solder forming the element connecting layer 8, thereby to join the element connecting layer 8 to a lower surface of the semiconductor laser 2 with soldering. Then, when the sub-mount 1 and the heat sink 3 are connected to each other by heating the sub-mount 1 and the heat sink 3 to a temperature that is not more than the melting temperature of the solder forming the element connecting layer 8 and is not less than the melting temperature of a solder forming the second-component connecting layer 9 in a laminated state with the second-component connecting layer 9 sandwiched therebetween to selectively melt the second-component connecting layer 9, thereby to join the second-component connecting layer 9 to an upper surface of the heat sink 3 with soldering, the semiconductor device 4 is manufactured.

The sub-mount 1 and the semiconductor laser 2 are generally connected to each other with the emission surface 12 and a side surface 13 on the same side of the emission surface 12 out of side surfaces, crossing the element connection surface 5 and the second-component connection surface 6, of the substrate 7 in the sub-mount 1 aligned so as to be flush with each other as illustrated, in order to prevent a luminous flux of the laser light 11 emitted from the emission surface 12 from being blocked by the sub-mount 1. However, when the sub-mount 1 and the semiconductor laser 2 are connected to each other, the solder forming the element connecting layer 8 may, in some cases, be melted by heating and solidified with the solder jutting out to the emission surface 12. In the case, the solder that has jutted out may block the luminous flux of the laser light 11 emitted from the emission surface 12 and may short-circuit the semiconductor laser 2.

Therefore, JP 06-350202 A (1994) previously described, JP 05-243690 A (1993), or the like discloses that the metal layer such as the Au layer for providing good wettability with the solder is formed so as to connect with not only the element connection surface 5 but also the side surface 13, to also provide the side surface 13 with good wettability with the solder, and the solder that has jutted out by being melted when the sub-mount 1 and the semiconductor laser 2 are connected to each other is guided so as to flow toward the side surface 13 by the function of the metal layer, thereby to prevent the solder from jutting out into the light emission surface 12. In order to obtain the same effect, JP 2003-46181 A or JP 08-330672 A (1996) discloses that a solder layer is previously formed on the metal layer formed on the side surface 13 so as to continue with the element connecting layer 8.

In recent years, a large current must be cause to flow in a semiconductor element such as a semiconductor laser particularly as the power of the semiconductor element increases. Therefore, an attempt to form a substrate of a heat spreader such as a sub-mount of a material containing a metal and having conductive properties and make the substrate itself also serve as an electrode of the element has been made. JP 2003-152145 A, for example, discloses that a substrate of a heat spreader such as a sub-mount is formed of a Cu—W composite material having a composite structure formed by infiltrating Cu into a pore of a porous body composed of W.

Even when a heat spreader in which a substrate is formed of a material including a metal such as the Cu—W composite material described above (which may be hereinafter referred to as a "metal-containing material") is used to compose a semiconductor device, the basic structure thereof is generally as illustrated in FIG. 15. It is considered that a structure for preventing a solder melted when the sub-mount 1 serving as a heat spreader and the semiconductor laser 2 serving as a semiconductor element are connected to each other from jutting out into the emission surface 12 of the semiconductor laser 2 is basically the same as the conventional structure.

However, the substrate 7 composed of the metal-containing material is itself superior in wettability with the solder to the conventional one composed of Si, ceramics, or the like. When the sub-mount 1 is connected to the heat sink 3, therefore, the solder forming the second-component connecting layer 9 may creep up along the side surface 13 of the substrate 7 to the vicinity of the emission surface 12 of the semiconductor laser 2 with the solder melted by heating, thereby to easily short-circuit the semiconductor laser 2 and block the luminous flux of the laser light 11 emitted from the emission surface 12.

Particularly when a solder superior in flowability at low temperature or a paste-shaped or foil-shaped solder, which is superior in the effect of improving yield in manufacturing the semiconductor device 4 because solder wetting defects such as a void preventing heat transfer may hardly occur so that a good solder joint can be obtained, is used as the solder forming the second-component connecting layer 9, the above-mentioned defects easily occur. The reason why the above defects can easily occur when the paste-shaped or foil-shaped solder is used is that the amount thereof is not easily controlled, so that an excessive amount of melted solder is easily produced.

SUMMARY OF THE INVENTION

An object of the present invention is to provide a heat spreader in which a melted solder does not easily creep up along a side surface of a substrate to the vicinity of a semiconductor element when the substrate is connected to a second-component, although the substrate is formed of a metal-containing material. The reason for this is that even when a solder superior in flowability at low temperature or a paste-shaped or foil-shaped solder, for example, is used as the solder, a good solder joint having a few solder wetting defects such as a void preventing heat transfer can be obtained while inhibiting more greatly than ever before the defects that the creeping of the solder short-circuits the semiconductor element and blocks, when the semiconductor element is a semiconductor laser or the like, a luminous flux of laser light or the like emitted from its emission surface. Another object of the present invention is to provide a semiconductor device using the heat spreader.

The present invention provides a heat spreader including a plate shaped substrate made of a material containing at least a metal and in which one surface is defined as an element connection surface for connecting a semiconductor element and an opposite surface is defined as a second-component connection surface for connecting a second-component, in which the second-component connection surface of the substrate is provided with wettability with a solder, and at least one region selected from the group consisting of at least a part of a side surface crossing the element connection surface and the second-component connection surface of the substrate and a region adjacent to the side surface of the second-component connection surface is subjected to solder block processing for preventing the solder from flowing.

According to the present invention, the synergy between the effect produced by providing the second-component connection surface of the substrate composed of a metal-containing material with good wettability with the solder and the effect produced by subjecting at least one of the region that is at least a part of the side surface of the substrate and the region adjacent to the side surface of the second-component connection surface to solder block processing for inhibiting the solder from flowing can make it difficult for the melted solder to creep up along the side surface of the substrate to the vicinity of the semiconductor element when the substrate is connected to the second-component, although the substrate is composed of the metal-containing material.

Therefore, according to the present invention, even when as the solder forming the second-component connecting layer, a solder superior in flowability at low temperature, or a paste-shaped or foil-shaped solder is used, for example, there can be provided a heat spreader capable of obtaining a good solder joint having a few solder wetting defects such as a void preventing heat transfer while inhibiting more greatly than ever before the defects that the creeping of the solder short-circuits the semiconductor element and blocks, when the semiconductor element is a semiconductor laser or the like, a luminous flux of laser light or the like emitted from its emission surface. In order to subject at least one of the region that is at least a part of the side surface of the substrate and the region adjacent to the side surface of the second-component connection surface to solder block processing, it is preferable that either one of the regions is coated with a solder block layer composed of a material low in wettability with the solder and low in flowability of the solder.

Examples of the above material include at least one metal selected from the group consisting of Pt, Mo, Pd, Cr and Al or a compound containing at least one of the metals. Further, it is preferable that at least a part of the element connection surface of the substrate is coated with an element connecting layer composed of a solder in order to achieve good connection to the semiconductor element, and it is preferable that the region adjacent to at least the element connection surface of the side surface of the substrate is also coated with the element connecting layer so that the melted solder can be guided toward the side surface in order to prevent the solder from jutting out to the emission surface of the semiconductor laser or the like serving as the semiconductor element.

It is preferable that the side surface of the substrate is finished such that an arithmetical mean roughness Ra of the roughness profile representing a surface roughness is 0.1 to 1.6 µm. When the arithmetical mean roughness Ra is less than the above-mentioned range, the melted solder may creep up along the side surface to the vicinity of the semiconductor element when the substrate is connected to the second-component, although at least one of the region that is at least a part of the side surface and the region, adjacent to the side surface of the second-component connection surface is coated with the solder block layer. This is conceivably caused since irregularities for inhibiting the melted solder from creeping up is small in size and number because of the high smoothness of the side surface. This might not sufficiently inhibit the defects that the solder that has crept up short-circuits the semiconductor element and blocks, when the semiconductor element is the semiconductor laser or the like, the luminous flux of the laser light emitted from the emission surface.

Furthermore, in order to finish the side surface of the substrate such that the arithmetical mean roughness Ra is less than the above-mentioned range, a long time period is required for cutting and polishing, which constitutes a factor reducing the productivities of the substrate and thus, the heat spreader and the semiconductor device to raise the manufacturing costs thereof. On the other hand, when the arithmetical mean roughness Ra exceeds the above-mentioned range, the solder melted when the semiconductor element is connected does not easily flow down along the side surface. This is conceivably caused since irregularities for inhibiting the melted solder from flowing down is large in size and number, contrary to the previous case. Even if the side surface is previously coated with the element connecting layer, therefore, the solder that juts out by being melted may jut out to the semiconductor element without being guided toward the side surface, thereby to easily short-circuit the semiconductor element and block, when the semiconductor element is the semiconductor laser or the like, the luminous flux of the laser light or the like emitted from the emission surface.

It is preferable that the substrate composed of the metal-containing material has a specific resistance of $1.6 \times 10^{-8}$ to $1.0 \times 10^{-3}$ Ωm, considering that the effect of making the substrate itself serve as an electrode of the element by forming the substrate of the metal-containing material having conductive properties is further improved. When the specific resistance exceeds the above-mentioned range, the effect of making the substrate itself serve as an electrode of the element cannot be sufficiently obtained. Besides, the substrate itself may generate heat when it serves as the electrode. A material (including a composite material) having a specific resistance of less than the above-mentioned range is limited to a special material, which is high in cost and is not easy to produce. This constitutes a factor reducing the productivities of the substrate and thus the heat spreader and the semiconductor device to raise the manufacturing costs thereof.

Characteristics of the substrate other than the specific resistance are not particularly limited. However, it is preferable that the substrate has a thermal conductivity of 150 to 650 W/m·K, considering that heat generated when the semiconductor element operates is transferred as smoothly as possible particularly in the substrate used for transferring heat from the semiconductor element required of high heat transfer characteristics such as a high-power semiconductor laser for laser beam machining. Further, it is preferable that the substrate has a thermal expansion coefficient of $2.0 \times 10^{-6}$ to $10 \times 10^{-6}$/K, considering that an excessive stress is prevented from being created in the semiconductor element by great expanding due to heat generated when the semiconductor element operates and great contracting due to the subsequent cooling so as not to damage the semiconductor element, degrade the characteristics thereof, and interrupt connection to the semiconductor element and the second-component.

Furthermore, it is preferable that the substrate composed of a metal-containing material satisfying each of the above-mentioned characteristics is composed of a mixture of at least one substance selected from the group consisting of W, Mo, SiC and diamond, and at least one substance selected from the group consisting of Cu, Al and Ag. An example of the specific configuration of the heat spreader according to the present invention is a configuration in which the element connection surface, the second-component connection surface and the side surface of the substrate composed of the metal-containing material such as the above-mentioned composite material are coated with an adhesion layer composed of Ni or a compound containing Ni and superior in the function of improving adhesion between each of the surfaces of the substrate and each of layers such as the previously described solder block layer, element connecting layer, second-component connecting layer, a subsequently described diffusion preventing layer and solder wetting layer, and an electrode layer for making the substrate itself serve as an electrode of the element and also superior in wettability with the solder, and in which the adhesion layer is exposed on the second-component connection surface, thereby to provide the second-component connection surface with wettability with the solder.

Furthermore, another example of the specific configuration of the heat spreader according to the present invention is a configuration in which the element connection surface, the second-component connection surface and the side surface of the substrate are coated with an adhesion layer composed of at least one metal selected from the group consisting of Ni, Ti, Cr and Cu or a compound containing at least one of the metals and superior in the function of improving adhesion between each of the surfaces of the substrate and each of the layers such as the previously described solder block layer, element connecting layer, second-component connecting layer, a subsequently described diffusion preventing layer and solder wetting layer, and an electrode layer for making the substrate itself serve as an electrode of the element, and with a diffusion preventing layer composed of at least one metal selected from the group consisting of Pt, Mo and Pd or a compound containing at least one of the metals, having a function of preventing the compositions of a solder for connection of the semiconductor element and a solder for connection to the second-component from being changed due to diffusion of the metal forming the adhesion layer into the solders, and low in wettability with the solder in this order, and the diffusion preventing layer is exposed as a solder block layer in at least one of a region, adjacent to at least the second-component connection surface of the side surface and a region adjacent to the side surface of the second-component connection surface so that the region is subjected to solder block processing.

Furthermore, in the heat spreader in the above-mentioned example, it is preferable that a region, other than the region in which the diffusion preventing layer must be exposed, of the second-component connection surface is coated with a solder wetting layer composed of at least one metal selected from the group consisting of Au, Ni and Ag or a compound containing at least one of the metals in order to provide the second-component connection surface with wettability with the solder.

The present invention provides a semiconductor device in which a semiconductor element is connected to the element connection surface of the substrate in the heat spreader according to the present invention through an element connecting layer composed of a solder, and a second-component is connected to the second-component connection surface through a second-component connecting layer composed of a solder having a melting point lower than that of the solder forming the element connecting layer. According to the present invention, there can be provided a highly-reliable semiconductor device that makes it difficult due to the function of the heat spreader previously described to short-circuit the semiconductor element and to block, when the semiconductor element is a semiconductor laser or the like, a luminous flux of laser light or the like emitted from its emission surface.

As a solder for connection to the semiconductor device, an Au—Sn-based or Au—Ge-based solder is preferably used. As a solder having a melting point lower than that of the above-mentioned solder and for connection to the second-component, there is used a Sn—Ag-based, Sn—Cu-based, Sn—In-based, Sn—Ge-based, Sn—Bi-based, Sn—Sb-based, Sn—Zn-based, Sn—Ag—Cu-based, Sn—Ag—Bi-based or Sn—Zn—Bi-based solder which is superior in flowability at low temperature and does not easily develop solder wetting defects such as a void preventing heat transfer because the solder does not easily creep up along the side surface of the substrate due to the effect of solder block processing.

According to the present invention, particularly when the semiconductor element is a semiconductor light emitting element required of high heat transfer characteristics, for example, a high-power semiconductor laser for laser beam machining or a high-luminance light emitting diode, a much better effect can be obtained. Examples of the second-component include a heat sink, a package, a circuit board, and a stem.

DETAILED DESCRIPTION OF PREFERRED EMBODIMENT

Figure 1:
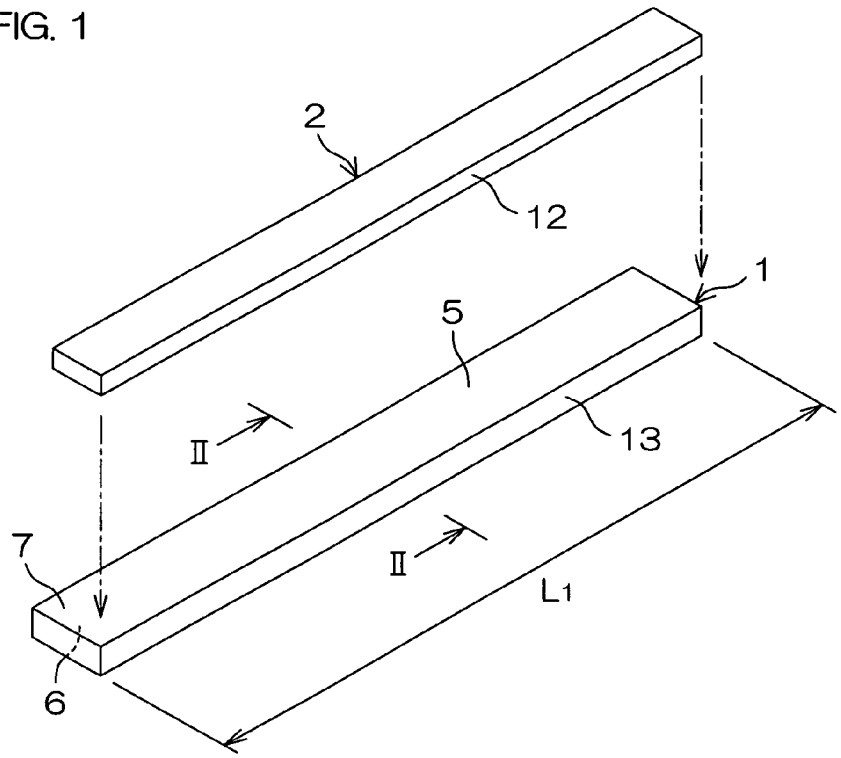
FIG. 1 is a perspective view showing the appearance of a sub-mount as an example of a heat spreader according to the present invention and a semiconductor laser serving as a semiconductor element to be connected to the sub-mount.
Figure 2:
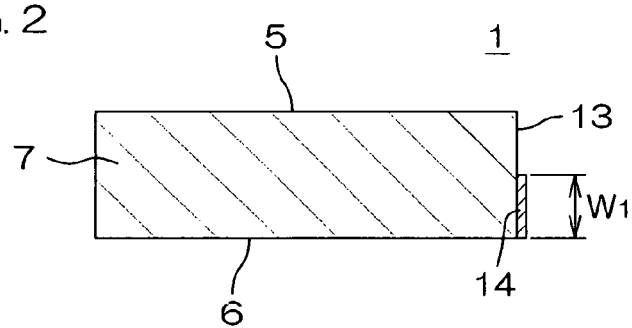
FIG. 2 is a sectional view of the sub-mount in the example taken along a line II-II in FIG. 1.

FIG. 1 is a perspective view showing the appearance of a sub-mount 1 as an example of a heat spreader according to the present invention and a semiconductor laser 2 serving as a semiconductor element to be connected to the sub-mount 1. FIG. 2 is a sectional view of the sub-mount 1 taken along a line II-II in FIG. 1. Referring to FIGS. 1 and 2, the sub-mount 1 in this example includes a substrate 7 which is formed in the shape of a plate and in which an upper surface and a lower surface of the plate respectively serve as an element connection surface 5 for connection of the semiconductor laser 2 and a second-component connection surface 6 for connection of a heat sink 3 (see FIG. 14) serving as a second-component. The plane shape of the substrate 7 is rectangular. Referring to FIG. 1, the semiconductor laser 2 is formed by laminating a plurality of semiconductor layers, electrode layers or the like in a vertical direction, and its one side surface crossing the direction of the lamination serves as an emission surface 12 for emitting laser light generated in an active layer provided halfway in the direction of the lamination.

The sub-mount 1 and the semiconductor laser 2 are connected to each other with the emission surface 12 and a side surface 13 on the same side of the emission surface 12 out of side surfaces, crossing the element connection surface 5 and the second-component connection surface 6, of the substrate 7 in the sub-mount 1 aligned so as to be flush with each other, as indicated by arrows of a one-dot and dash line, in order to prevent the sub-mount 1 from blocking a luminous flux of the laser light emitted from the emission surface 12. The substrate 7 is formed of a metal-containing material in order that the substrate itself also serves as an electrode of the element. Examples of the metal-containing material include metal such as Cu, Ag, W, Mo and Al, alloys or composite materials of two or more of the above-mentioned metals, and composite materials of one or two or more types of the above-mentioned metals, and Si, SiC, diamond or the like.

Specific examples of the above-mentioned composite materials include:

(1) A Cu—W composite material or a Cu—Mo composite material having a composite structure formed by infiltrating Cu into a pore of a porous body composed of W or Mo;

(2) A Cu-diamond composite material having a composite structure obtained by bonding a large number of fine diamond particles to one another using Cu serving as a bonding material;

(3) An Al—SiC composite material having a composite structure in which SiC is dispersed in a particulate shape in Al; and (4) An Al—Si alloy having a composite structure in which Si is dispersed in a particulate shape in Al.

A cladding material having a laminated structure obtained by laminating two or more types of layers each composed of any one of the metals, the alloys and the composite materials, described above, is also suitably used as the metal-containing material forming the substrate 7. Specific examples of the cladding material include:

(5) A Cu/Cu—Mo/Cu cladding material obtained by laminating a Cu layer on each of both surfaces of the Cu—Mo composite material layer in the item (1) having a composite structure formed by infiltrating Cu into a pore of a porous body composed of Mo;

(6) A Cu/Mo/Cu cladding material obtained by laminating a Cu layer, a Mo layer, and a Cu layer in this order;

(7) A Cu/Cu-diamond/Cu cladding material obtained by laminating a Cu layer on each of both surfaces of the Cu-diamond composite material layer in the item (2) having a composite structure formed by bonding a large number of fine diamond particles to one another using Cu serving as a bonding material; and (8) An Al/Al—SiC/Al cladding material obtained by laminating an Al layer on each of both surfaces of the Al—SiC composite material layer in the item (3) having a composite structure in which SiC is dispersed in a particulate shape in Al.

It is preferable that the substrate 7 formed of the metal-containing material, for example, the composite material or the cladding material, mentioned above, has a specific resistance of $1.6 \times 10^{-8}$ to $1.0 \times 10^{-3}$ $\Omega$m and particularly $1.6 \times 10^{-8}$ to $4.0 \times 10^{-4}$ $\Omega$m, considering that the effect produced by making the substrate 7 itself also serve as an electrode for the element is further improved. When the specific resistance exceeds the above-mentioned range, the effect produced by making the substrate 7 itself serve as an electrode for the element cannot be sufficiently obtained. Besides, the substrate 7 may generate heat when it serves as an electrode. A material having a specific resistance of less than the above-mentioned range is limited to a specific material, which is high in cost and is not easy to produce. This constitutes a factor reducing the productivities of the substrate 7 and thus the sub-mount 1 and a semiconductor device 4 (see FIG. 14) formed using the sub-mount 1 to raise the manufacturing costs thereof.

Furthermore, it is preferable that the substrate 7 has a thermal conductivity of 150 to 650 W/m·K and particularly 300 to 650 W/m·K, considering that particularly when the substrate 7 is used for transferring heat from a high-power semiconductor laser 2 for laser beam machining, the heat generated when the semiconductor laser 2 operates is transferred as smoothly as possible. When the substrate 7 has a thermal conductivity of less than the above-mentioned range, heat generated by the semiconductor laser 2 cannot be efficiently allowed to escape to the heat sink 3, thereby to create the possibilities of reducing the operating efficiency of the semiconductor laser 2, shortening the life thereof, and damaging the semiconductor laser 2 before the life thereof is over. Furthermore, it is difficult to produce the substrate 7 which has a thermal conductivity exceeding the above-mentioned range with a metal-containing material.

Furthermore, it is preferable that the substrate 7 has a thermal expansion coefficient of $2.0 \times 10^{-6}$ to $10 \times 10^{-6}$/K, considering that an excessive stress is prevented from being created in the semiconductor laser 2 by great expanding due to heat generated when the semiconductor laser 2 operates and great contracting due to the subsequent cooling so as not to damage the semiconductor laser 2, degrade the characteristics thereof, and interrupt the connection thereof. Particularly when the semiconductor laser 2 is composed of a GaAs-based or GaN-based semiconductor material, it is preferable that the thermal expansion coefficient of the substrate 7 is $4.0 \times 10^{-6}$ to $8.0 \times 10^{-6}$/K, which is close to the thermal expansion coefficient of the semiconductor material.

In order to adjust each of the characteristics within a suitable range, the composition of the metal-containing material forming the substrate 7, the composite structure of the composite material, the composite structure of the cladding material, and the thickness of each of the layers may be respectively adjusted. Examples of a suitable metal-containing material, which can form the substrate 7 whose characteristics respectively satisfy the above-mentioned ranges by such adjustments composed of a mixture of at least one substance selected from the group consisting of W, Mo, SiC and diamond, and at least one substance selected from the group consisting of Cu, Al and Ag among the various types of materials previously described. Particularly from the point of view of the thermal conductivity, the Cu-diamond composite material in the item (2) is preferable. On the other hand, from the point of view of the specific resistance and the point of view of the manufacturing cost, the Cu—W composite material and the Cu—Mo composite material in the item (1), the Cu/Cu—Mo/Cu cladding material in the item (5), and so on are preferable.

Referring to FIG. 2, in the sub-mount 1 in the example as illustrated, the second-component connection surface 6 of the substrate 7 formed of the metal-containing material such as the above-mentioned composite material is provided with wettability with the solder, and a region on the lower side, adjacent to the second-component connection surface 6, of the side surface 13 on the side of the emission surface 12 of the semiconductor laser 2 is coated with a solder block layer 14 composed of a material low in wettability with the solder and flowability of the solder and having the function of inhibiting the flow thereof and is subjected to solder block processing when the substrate 7 is connected to the semiconductor laser 2.

When the side surface 13 is subjected to solder block processing by forming the solder block layer 14, for example, the synergy between the effect produced by subjecting the side surface 13 to solder block processing and the effect produced by providing the second-component connection surface 6 of the substrate 7 with wettability with the solder makes it difficult for the melted solder to jut out to the side surface 13 from the second-component connection surface 6 and for the solder that has jutted out to creep up along the side surface 13 to the vicinity of the emission surface 12 of the semiconductor laser 2 when the substrate 7 is connected to the heat sink 3. Even when as the solder, a solder superior in flowability at low temperature or a paste-shaped or foil-shaped solder is used, for example, therefore, a good solder joint having a few solder wetting defects such as a void preventing heat transfer can be obtained while inhibiting more greatly than ever before the defects that the solder that has crept up short-circuits the semiconductor laser 2 and blocks the luminous flux of the laser light emitted from the emission surface 12 of the semiconductor laser 2.

Examples of the material, low in wettability with the solder and flowability of the solder, forming the solder block layer 14 include at least one metal selected from the group consisting of Pt, Mo, Pd, Cr and Al or a compound containing at least one of the metals. Particularly, it is preferable that Pt, Mo, Pd, or the like is independently used to form the solder block layer 14. The solder block layer 14 composed of any one of the metals independently used is easy to be formed by vacuum deposition or the like in addition to being superior in the function of blocking the solder. Further, the solder block layer 14 thus obtained easily serves also as a diffusion preventing layer.

It is preferable that the thickness of the solder block layer 14 is 0.01 to 1 μm. When the thickness is less than the above-mentioned range, the effect of preventing the flow of the solder as the solder block layer 14 may not be sufficiently obtained. Even when the thickness exceeds the above-mentioned range, a further effect cannot be obtained. Besides, this constitutes a factor raising the manufacturing costs of the sub-mount 1 and thus the semiconductor device 4. Further, it is preferable that a formation width $W_1$, in the thickness direction of the substrate 7, of the solder block layer 14 is not less than 0.025 mm. When the formation width $W_1$ is less than the above-mentioned range, the effect of preventing the flow of the solder as the solder block layer may not be sufficiently obtained.

The upper limit of the formation width $W_1$ is the thickness of the substrate 7. That is, the solder block layer 14 may be formed on the whole side surface 13 of the substrate 7. However, it is preferable that a region, where the solder block layer 14 is not formed, having a width of not less than 0.075 mm in the thickness direction of the substrate 7 is provided, as illustrated, in an upper region, in contact with the element connection surface 5, of the side surface 13. This assists the solder melted when the semiconductor laser 2 is connected in flowing down along the side surface, which can prevent the solder from jutting out to the emission surface 12 of the semiconductor laser 2. The solder block layer 14 can be formed by various types of film forming methods such as vacuum deposition, sputtering, ion plating, and wet plating.

In order to provide the second-component connection surface 6 of the substrate 7 with wettability with the solder, the second-component connection surface 6 may be coated with a layer composed of a material superior in wettability with the solder, which is not illustrated. Examples of the material, superior in wettability with the solder, forming the above-mentioned layer include at least one metal selected from the group consisting of Au, Ni and Ag or a compound containing at least one of the metals. It is preferable that the side surface 13 of the substrate 7 and desirably the whole surface thereof is finished such that the arithmetical mean roughness Ra of the roughness profile representing a surface roughness defined in JIS B0601:2001 "Geometrical Product Specifications (GPS)—Surface texture: Profile method—Terms, definitions and surface texture parameters" (which corresponds to ISO 4287:1997) is 0.1 to 1.6 μm and particularly 0.1 to 0.9 μm.

When the arithmetical mean roughness Ra is less than the above-mentioned range, the melted-solder may creep up along the side surface 13 to the vicinity of the emission surface 12 of the semiconductor laser 2 when the substrate 7 is connected to the heat sink 3, although the above-mentioned region of the side surface 13 is subjected to solder block processing by being coated with the solder block layer 14, for example. This is conceivably caused since irregularities for inhibiting the melted solder from creeping up is small in size and number because of the high smoothness of the side surface 13. This might not sufficiently inhibit the defects that the solder that has crept up short-circuits the semiconductor laser 2 and blocks the luminous flux of the laser light emitted from the emission surface 12.

Furthermore, in order to finish the side surface 13 such that the arithmetical mean roughness Ra thereof is less than the above-mentioned range, a long time period is required for cutting and polishing, which constitutes a factor reducing the productivities of the substrate 7 and thus the sub-mount 1 and the semiconductor device 4 to raise the manufacturing costs thereof. On the other hand, when the arithmetical mean roughness Ra exceeds the above-mentioned range, the solder melted when the semiconductor laser 2 is connected does not easily flow down along the side surface. This is conceivably caused because irregularities for inhibiting the melted solder from flowing down are large in size and number, contrary to the previous case. Therefore, the solder that has been melted may easily jut out to the emission surface 12 of the semiconductor laser 2 without being guided toward the side surface 13, to block the luminous flux of the laser light or the like emitted from the emission surface 12.

Although the other configuration of the substrate 7 is not particularly limited, it is preferable that the respective arithmetical mean roughnesses Ra of the element connection surface 5 and the second-component connection surface 6 are not more than 1.6 μm and particularly 0.01 to 0.9 μm. When the arithmetical mean roughnesses Ra exceed the above-mentioned range, irregularities on both the surfaces 5 and 6 are increased to easily remain, when the semiconductor laser 2 and the heat sink 3 are connected to the substrate 7, as void for preventing heat conduction on their connection interface. Therefore, heat generated by the semiconductor laser 2 cannot be-efficiently allowed to escape to the heat sink 3, thereby to create the possibilities of reducing the operating efficiency of the semiconductor laser 2, shortening the life thereof, and damaging the semiconductor laser 2 before the life thereof is over.

On the other hand, in order to finish the element connection surface 5 and the second-component connection surface 6 such that the arithmetical mean roughnesses Ra thereof are less than the above-mentioned range, a long time period is required for cutting and polishing, which constitutes a factor reducing the productivities of the substrate 7 and thus the sub-mount 1 and the semiconductor device 4 to raise the manufacturing costs thereof. It is preferable that the thickness of the substrate 7 is 0.15 to 10 mm. When the thickness is less than the above-mentioned range, the melted solder may creep up along the side surface 13 to the vicinity of the emission surface 12 of the semiconductor laser 2 when the substrate 7 is connected to the heat sink 3 even if the side surface 13 is subjected to solder block processing by being coated with the solder block layer 14, for example. This is conceivably caused because the distance between the element connection surface 5 and the second-component connection surface 6 that are separated from each other by the side surface 13 is short.

This might not sufficiently inhibit the defects that the solder that has crept up short-circuits the semiconductor laser 2 and blocks the luminous flux of the laser light emitted from the emission surface 12. On the other hand, even when the thickness of the substrate 7 exceeds the above-mentioned range, a further effect of preventing the solder from creeping up and a further effect of increasing the transfer amount are hardly obtained, and the material costs pile up, which also constitutes a factor of raising the manufacturing costs of the substrate 7 and thus the sub-mount 1 and the semiconductor device 4.

In order to process the substrate 7 into a predetermined shape and a predetermined surface roughness, various types of processing methods can be used. In the cases of the Cu—W composite material or the Cu—Mo composite material in the item (1), the Cu-diamond composite material in the item (2) or the Cu/Cu—Mo/Cu cladding material in the item (5), a precursor of a substrate formed in the shape of a plate can be cut out into a predetermined plate shape by wire electric discharge machining, and its side surface can be finished to a predetermined surface roughness. Particularly when the wire electric discharge machining is divided into the cutting process, the rough finishing process of a cut surface and the final finishing process of the cut surface, and the substrate 7 is processed while changing discharge conditions in each of the processes, the side surface can be easily finished to a predetermined surface roughness.

It is preferable that the warping amount in the diagonal direction of the element connection surface 5, of the sub-mount 1 serving as the heat spreader according to the present invention in which a predetermined surface of the substrate 7 is subjected to the above-mentioned processings is not more than 1 μm and particularly not more than 0.5 μm per millimeter in length in the diagonal direction. When the warping amount exceeds the above-mentioned range, the sub-mount 1 and the semiconductor laser 2 or the heat sink 3 cannot adhere to each other with no space therebetween, so that a space can be easily left therebetween on their connection boundary surface. Therefore, heat generated by the semiconductor laser 2 cannot be efficiently allowed to escape to the heat sink 3, thereby to create the possibilities of reducing the operating efficiency of the semiconductor laser 2, shortening the life thereof, and damaging the semiconductor laser 2 before the life thereof is over. Note that it is most preferable that the minimum value of the warping amount is 0 μm per millimeter, i.e., there is no warping.

Figure 3:
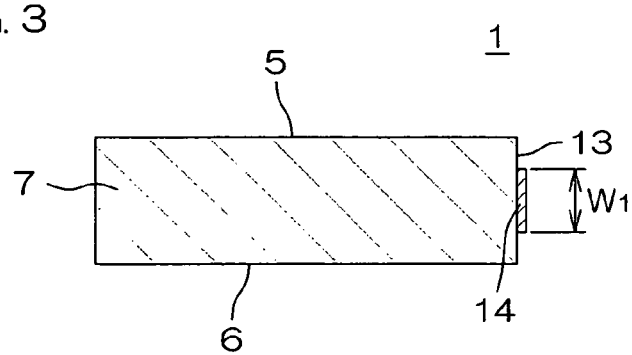
FIG. 3 is a sectional view showing a modified example of the sub-mount.

FIG. 3 is a sectional view showing a modified example of the sub-mount 1. Referring to FIG. 3, the sub-mount 1 in this example differs from that in the example shown in FIG. 2 in that the solder block layer 14 is formed in an intermediate region in the thickness direction of the side surface 13. However, the configuration of the substrate 7 itself is the same as that in the example shown in FIG. 2. It is preferable that the second-component connection surface 6 is provided with wettability by being coated with a layer superior in wettability with the solder, for example, and that the side surface 13 is finished to a predetermined surface roughness, as in the example shown in FIG. 2. It is also preferable that the thickness of the solder block layer 14 is approximately the same. It is preferable that a formation width $W_1$, in the thickness direction of the substrate 7, of the solder block layer 14 is not less than 0.025 mm. When the formation width $W_1$ is less than the above-mentioned range, the effect of preventing the flow of the solder as the solder block layer may not be sufficiently obtained.

Also in this example, the synergy between the effect produced by providing the second-component connection surface 6 of the substrate 7 with wettability with the solder for connection to the heat sink 3 and the effect produced by forming the solder block layer 14 makes it difficult for the melted solder to jut out to the side surface 13 from the second-component connection surface 6 and for the solder that has jutted out to creep up along the side surface 13 to the vicinity of the emission surface 12 of the semiconductor laser 2 when the substrate 7 is connected to the heat sink 3. Even when as the solder, a solder superior in flowability at low temperature or a paste-shaped or foil-shaped solder is used, for example, therefore, a good solder joint having a few solder wetting defects such as a void preventing heat transfer can be obtained while inhibiting more greatly than ever before the defects that the solder that has crept up short-circuits the semiconductor laser 2 and blocks the luminous flux of the laser light emitted from the emission surface 12 of the semiconductor laser 2.

Figure 4:
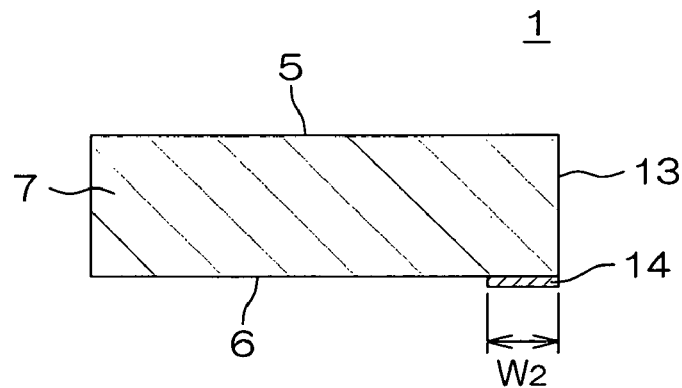
FIG. 4 is a sectional view showing another modified example of the sub-mount.

FIG. 4 is a sectional view showing another modified example of the sub-mount 1. Referring to FIG. 4, the sub-mount 1 in this example differs from those in the examples shown in FIGS. 2 and 3 in that the solder block layer 14 is formed on not the side surface 13 but a region, adjacent to the side surface 13, of the second-component connection surface 6. However, the configuration of the substrate 7 itself is the same as that in the example shown in FIG. 2. It is preferable that a region, where the solder block layer 14 is not formed, of the second-component connection surface 6 is provided with wettability with the solder by being coated with a layer superior in wettability with the solder, for example, and that the side surface 13 is finished to a predetermined surface roughness, as in the example shown in FIG. 2.

It is preferable that the thickness of the solder block layer 14 is also approximately the same. It is preferable that a formation width $W_2$, in the width direction of the substrate 7, of the solder block layer 14 is 0.025 to 0.5 mm. When the formation width $W_2$ is less than the above-mentioned range, the effect of preventing the flow of the solder as the solder block layer may not be sufficiently obtained. Even when the formation width $W_2$ exceeds the above-mentioned range, a further effect may not be obtained.

Also in this example, the synergy between the effect produced by providing the second-component connection surface 6 of the substrate 7 with wettability with the solder for connection to the heat sink 3 and the effect produced by forming the solder block layer 14 makes it difficult for the melted solder to jut out to the side surface 13 from the second-component connection surface 6 and for the solder that has jutted out to creep up along the side surface 13 to the vicinity of the emission surface 12 of the semiconductor laser 2 when the substrate 7 is connected to the heat sink 3. Even when as the solder, a solder superior in wettability at low temperature or a paste-shaped or foil-shaped solder is used, for example, therefore, a good solder joint having a few solder wetting defects such as a void preventing heat transfer can be obtained while inhibiting more greatly than ever before the defects that the solder that has crept up short-circuits the semiconductor laser 2 and blocks the luminous flux of the laser light emitted from the emission surface 12 of the semiconductor laser 2.

Figure 5:
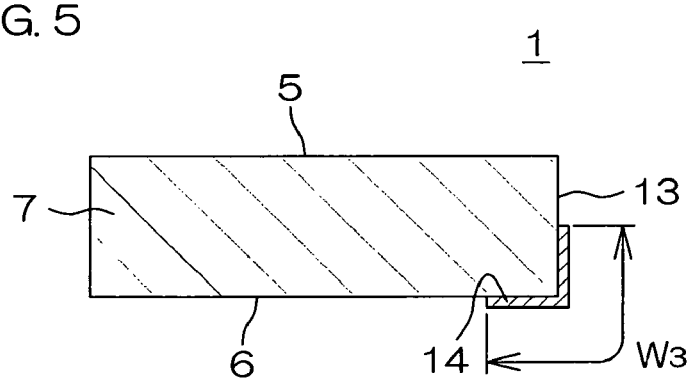
FIG. 5 is a sectional view showing still another modified example of the sub-mount.

FIG. 5 is a sectional view showing still another modified example of the sub-mount 1. Referring to FIG. 5, the sub-mount 1 in this example differs from those in the examples shown in FIGS. 2 to 4 in that the solder block layer 14 is formed in a lower half region, adjacent to the second-component connection surface 6, of the side surface 13 and a region, adjacent to the side surface 13, of the second-component connection surface 6 such that the regions are continuous with each other. Also in this example, the configuration of the substrate 7 itself is the same as that in the example shown in FIG. 2. It is preferable that a region, where the solder block layer 14 is not formed, of the second-component connection surface 6 is provided with wettability with the solder by being coated with a layer superior in wettability with the solder, which is not illustrated, for example, and that the side surface 13 is finished to a predetermined surface roughness as in the example shown in FIG. 2.

It is preferable that the thickness of the solder block layer 14 is also approximately the same. It is preferable that a formation width $W_3$, in the width direction and the thickness direction of the substrate 7, of the solder block layer 14 is 0.025 to 0.5 mm, as in the example previously described. When the formation width $W_3$ is less than the above-mentioned range, the effect of preventing the flow of the solder as the solder block layer may not be sufficiently obtained. Even when the formation width $W_3$ exceeds the above-mentioned range, a further effect may not be obtained. The solder block layer 14 on the side surface 13 of the substrate 7 may be formed on the whole surface thereof. However, it is preferable that a region, where the solder block layer 14 is not formed, having a width of not less than 0.075 mm in the thickness direction of the substrate 7 is provided in an upper region, in contact with the element connection surface 5, of the side surface 13 from the same reason as in the example shown in FIG. 2.

Also in this example, the synergy between the effect produced by providing the second-component connection surface 6 of the substrate 7 with wettability with the solder for connection to the heat sink 3 and the effect produced by forming the solder block layer 14 makes it difficult for the melted solder to jut out to the side surface 13 from the second-component connection surface 6 and for the solder that has jutted out to creep up along the side surface 13 to the vicinity of the emission surface 12 of the semiconductor laser 2 when the substrate 7 is connected to the heat sink 3. Even when as the solder, a solder superior in flowability at low temperature or a paste-shaped or foil-shaped solder is used, for example, therefore, a good solder joint having a few solder wetting defects such as a void preventing heat transfer can be obtained while inhibiting more greatly than ever before the defects that the solder that has crept up short-circuits the semiconductor laser 2 and blocks the luminous flux of the laser light emitted from the emission surface 12 of the semiconductor laser 2.

Figure 6:
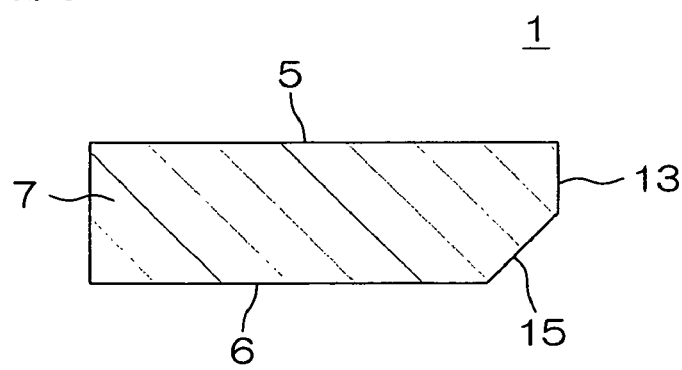
FIG. 6 is a sectional view showing a modified example of a substrate for forming the sub-mounts shown in FIGS. 2 to 5.

FIG. 6 is a sectional view showing a modified example of the substrates 7 for forming the sub-mounts 1 shown in FIGS. 2 to 5. Referring to FIG. 6, the substrate 7 in this example differs from the substrate 7 in each of the above-mentioned examples in that a C-surface (chamfering surface) 15 is provided on an edge line between the side surface 13 and the second-component connection surface 6. When the C-surface 15 is provided at the position, a portion of the C-surface 15 serves as a solder reservoir recessed from the side surface 13 of the substrate 7 to receive the melted solder when the sub-mount 1 and the heat sink 3 are connected to each other.

Therefore, it is possible to more reliably prevent the defects that the solder that has crept up short-circuits the semiconductor laser 2 and blocks the luminous flux of the laser light emitted from the emission surface 12. It is preferable that the size of the C-surface 15 is 0.05 to 0.3 mm. The solder block layer 14 may be formed in at least one of a region on the lower side of the figure, adjacent to at least the C-surface, of the side surface 13, the C-surface 15, and a region, adjacent to the C-surface 15, of the second-component connection surface 6.

Figure 7:
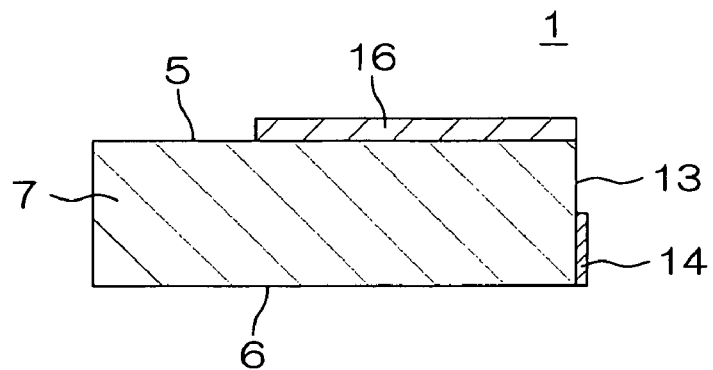
FIG. 7 is a sectional view showing still another modified example of the sub-mount.
Figure 8:
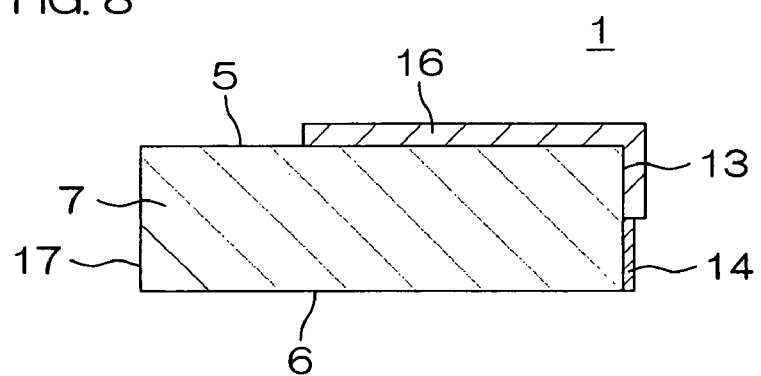
FIG. 8 is a sectional view showing still another modified example of the sub-mount.
Figure 9:
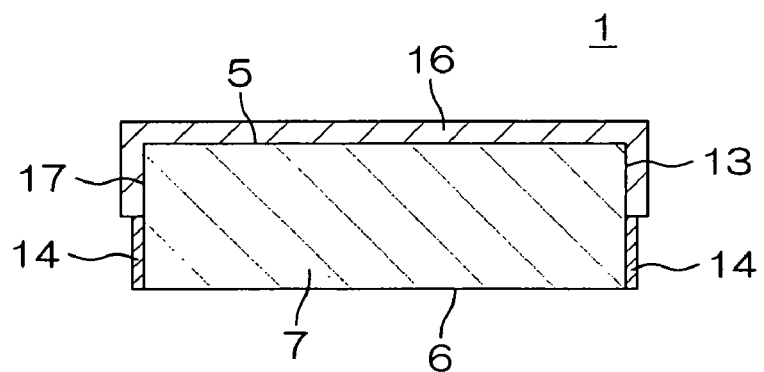
FIG. 9 is a sectional view showing still another modified example of the sub-mount.

FIGS. 7 to 9 are sectional views respectively showing still another modified examples of the sub-mount 1. Referring to FIG. 7, the sub-mount 1 in this example differs from that in the example shown in FIG. 2 in that a region, to which the semiconductor laser 2 is connected, of the element connection surface 5 of the substrate 7 is coated with an element connecting layer 16 composed of a solder for connection to the semiconductor laser 2. As the solder forming the element connecting layer 16, various types of solders are usable which are composed of at least one metal selected from the group consisting of In, Sn, Ag, Au, Ge, Si, Cu and Al or a compound containing at least one of the metals and have a melting point higher than that of a solder for connection of the heat sink 3.

Particularly, an Au—Sn-based or Au—Ge-based solder having a melting point of not less than 270° C. is suitably used. The solder has a high melting point. Further, it is relatively difficult for the solder to flow. Therefore, it is not easy to uniformly film the solder by heating and melting a foil-shaped solder preform, for example. If the element connection surface 5 is previously coated with the solder as the element connecting layer 16 by vacuum deposition or the like, however, a required minimum amount of solder allows good connection to the semiconductor laser 2. It is preferable that the thickness of the element connecting layer 16 is 1 to 15 μm and particularly 3 to 7 μm.

When the thickness is less than the above-mentioned range, the amount of solder is insufficient. Therefore, a void preventing heat conduction easily occurs on a connection surface between the sub-mount 1 and the semiconductor laser 2. On the other hand,-when-the thickness exceeds the above-mentioned range, the solder serves as a heat resistance to easily prevent heat conduction. Therefore, in either case, heat generated by the semiconductor laser 2 cannot be efficiently allowed to escape to the heat sink 3, thereby to create the possibilities of reducing the operating efficiency of the semiconductor laser 2, shortening the life thereof, and damaging the semiconductor laser 2 before the life thereof is over.

The element connecting layer 16 can be formed by various types of film forming methods such as vacuum deposition, sputtering, ion plating, and wet plating. Further, the foil-shaped solder preform can be also heated and welded while being superimposed at a predetermined position of the substrate 7 to form the element connecting layer 16. Particularly in order to form the element connecting layer 16 having a uniform thickness and composition, vacuum deposition, sputtering and ion plating are preferable. The element connecting layer 16 may have a laminated structure of two or more layers respectively composed of solders of different compositions.

The element connecting layer 16 may be formed in a region, to which the semiconductor laser 2 is connected, on the element connection surface 5 of the substrate 7 and a region, above a region where the solder block layer 14 is formed, adjacent to the element connection surface 5, of the side surface 13 such that the regions are continuous with each other as shown in FIG. 8. This can prevent the solder that has jutted out by being melted when the semiconductor laser 2 is connected to the element connection surface 5 from jutting out to the emission surface 16 of the semiconductor laser 2 by being guided so as to flow toward the side surface 13 by the function of the element connecting layer 16.

As shown in FIG. 9, the element connecting layer 16 can be also formed in the whole of the element connection surface 5 of the substrate 7 and not only a region, above a region where the solder block layer 14 is formed, adjacent to the element connection surface 5, of the side surface 13 but also an upper region, adjacent to the element connection surface 5, of other side surface 17 such that the regions are continuous with each other, as shown in FIG. 9. This can prevent the solder that has jutted out by being melted when the semiconductor laser 2 is connected to the element-connection surface 5 from jutting out to the emission surface 16 of the semiconductor laser 2 by being guided so as to flow toward the side surfaces 13 and 17 by the function of the element connecting layer 16. Although in the example as illustrated, the solder block layers 14 are respectively formed in lower regions, adjacent to the second-component connection surface 6, of not only the side surface 13 but also the side surface 17, the solder block layers 14 may be formed on only the side surface 13, as in the previous two examples, or may be formed on all the side surfaces.

Figure 10:
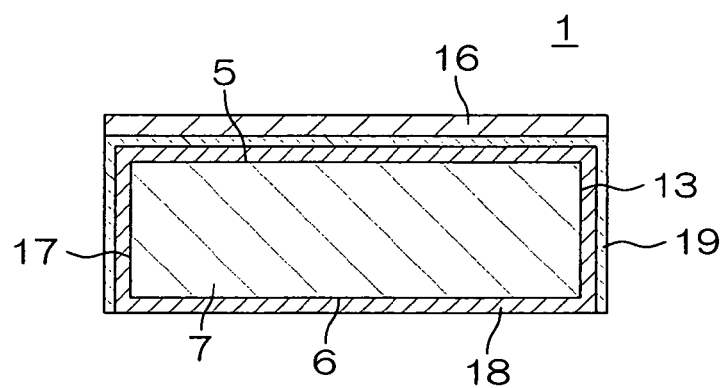
FIG. 10 is a sectional view showing still another modified example of the sub-mount.

FIG. 10 is a sectional view showing still another modified example of the sub-mount 1. Referring to FIG. 10, in the sub-mount 1 in the example, the whole surface of the substrate 7, i.e., the element connection surface 5, the second-component connection surface 6, the side surface 13, the side surface 17, etc., are coated with an adhesion layer 18 composed of a material superior in the function of improving adhesion between the surfaces of the substrate 7 and various types of layers formed thereon and the material superior in wettability with the solder, and the adhesion layer 18 is exposed on the second-component connection surface 6 so that the second-component connection surface 6 is provided with wettability with the solder. Examples of the material, having the above-mentioned function, forming the adhesion layer 18 include Ni or a compound containing Ni.

It is preferable that the thickness of the adhesion layer 18 is 0.01 to 5 μm. When the thickness is less than the above-mentioned range, the effect of improving adhesion of solder by the adhesion layer 18 may not be sufficiently obtained. On the other hand, when the thickness exceeds the above-mentioned range, the adhesion layer 18 serves as a heat resistance to easily prevent heat conduction. Therefore, heat generated by the semiconductor laser 2 cannot be efficiently allowed to escape to the heat sink 3, to create the possibilities of reducing the operating efficiency of the semiconductor laser 2, shortening the life thereof, and damaging the semiconductor laser 2 before the life thereof is over. Further, the adhesion layer 18 may be also easily pealed off. The adhesion layer 18 can be formed by various types of film forming methods such as vacuum deposition, sputtering, ion plating, and wet plating.

The surface, other than the second-component connection surface 6, of the substrate 7, i.e., the adhesion layer 18 on the element connection surface 5, the side surface 13, the side surface 17, etc., is shielded by being coated with a diffusion preventing layer 19 having the function of preventing the composition of the solder from being changed due to diffusion of a metal forming the adhesion layer 18 into the solder and composed of a material low in wettability with the solder. Examples of the material, which has the above-mentioned function, forming the diffusion preventing layer 19 include at least one metal selected from the group consisting of Pt, Mo and Pd or a compound containing at least one of the metals. In the example as illustrated, the diffusion preventing layer 19 is exposed as a solder block layer on the side surfaces 13 and 17, etc., of the substrate 7, so that both the side surfaces 13 and 17, etc., are subjected to solder block processing. Further, the diffusion preventing layer 19 on the element connection surface 5 is coated with the element connecting layer 16 composed of the solder for connection to the semiconductor laser 2.

It is preferable that the thickness of the diffusion preventing layer 19 is 0.01 to 1 μm. When the thickness is less than the above-mentioned range, the effect of preventing the metal forming the adhesion layer 18 from being diffused by the diffusion preventing layer 19 may not be sufficiently obtained. Even when the thickness exceeds the above-mentioned range, a further effect cannot be obtained. Besides, this constitutes a factor raising the manufacturing costs of the sub-mount 1 and thus the semiconductor device 4. The diffusion preventing layer 19 can be formed by various types of film forming methods such as vacuum deposition, sputtering, ion plating, and wet plating.

According to the sub-mount 1 in the above-mentioned example, the synergy between the effect produced by exposing the adhesion layer 18 on the second-component connection surface 6 of the substrate 7 to provide the second-component connection surface 6 with wettability with the solder for connection to the heat sink 3 and the effect produced by exposing the diffusion preventing layer 19 on both the side surfaces 13 and 17, etc., to perform solder block processing inhibits the melted solder from jutting out to the side surfaces 13 and 17 from the second-component connection surface 6 and inhibits the solder that has jutted out from creeping up along the side surfaces 13 and 17 to the vicinity of the emission surface 12 of the semiconductor laser 2 when the substrate 7 is connected to the heat sink 3, which can prevent the defects that the solder that has crept up short-circuits the semiconductor laser 2 and blocks the luminous flux of the laser light emitted from the emission surface 12 of the semiconductor laser 2.

Figure 11:
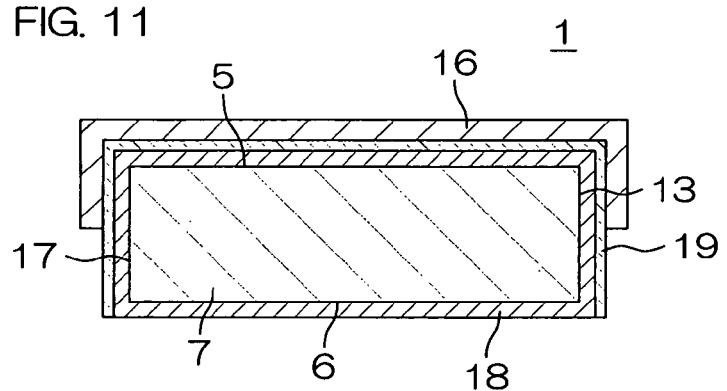
FIG. 11 is a sectional view showing still another modified example of the sub-mount.

FIG. 11 is a sectional view showing still another modified example of the sub-mount 1. Referring to FIG. 11, the sub-mount 1 in this example differs from that in the example shown in FIG. 10 in that the element connecting layer 16 is formed on the whole of the element connection surface 5 of the substrate 7 and respective upper regions, adjacent to the element connection surface 5, of the side surfaces 13 and 17, etc. When the element connecting layer 16 is formed as illustrated, the solder that has jutted out by being melted when the semiconductor laser 2 is connected to the element connection surface 5 can be prevented from jutting out to the emission surface 12 of the semiconductor laser 2 by being guided so as to flow toward the side surfaces 13 and 17 by the function of the element connecting layer 16.

Figure 12:
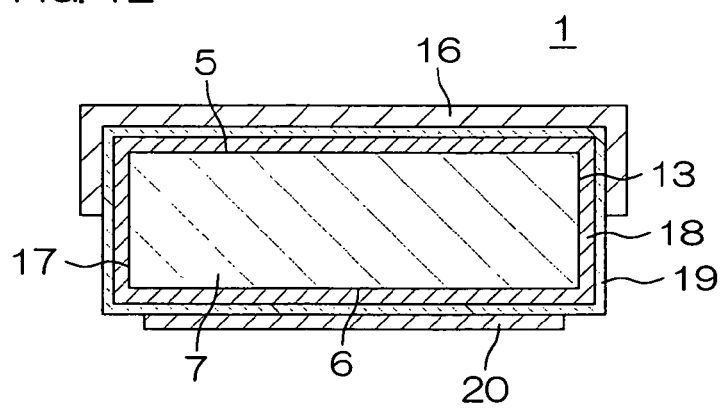
FIG. 12 is a sectional view showing still another modified example of the sub-mount.

FIG. 12 is a sectional view showing still another modified example of the sub-mount 1. Referring to FIG. 12, in the sub-mount 1 in this example, the whole surface of the substrate 7, i.e., the element connection surface 5, the second-component connection surface 6, the side surfaces 13 and 17, etc., are coated with the adhesion layer 18 superior in the function of improving adhesion between the surfaces of the substrate 7 and various types of layers formed thereon and the diffusion preventing layer 19 previously described, in this order, and the diffusion preventing layer 19 is exposed as a solder block layer in respective regions, adjacent to the second-component connection surface 6, of the side surfaces 13 and 17, etc., and regions, adjacent to the side surfaces 13 and 17, of the second-component connection surface 6 so that the regions are subjected to solder block processing. Examples of a material, which has the above-mentioned function, forming the adhesion layer 18 include at least one metal selected from the group consisting of Ni, Ti, Cr and Cu or a compound containing at least one of the metals.

A region, other than the region in which the diffusion preventing layer 19 is exposed, of the second-component connection surface 6 is provided with wettability with the solder by being coated with a solder wetting layer 20. Examples of a material, superior in wettability with the solder, forming the solder wetting layer 20 include at least one metal selected from the group consisting of Au, Ni and Ag or a compound containing at least one of the metals.

It is preferable that the thickness of the solder wetting layer 20 is 0.01 to 5 μm. When the thickness is less than the above-mentioned range, the effect of improving wettability with the solder by the solder wetting layer 20 may not be sufficiently obtained. Even when the thickness exceeds the above-mentioned range, a further effect cannot be obtained. Besides, this constitutes a factor raising the manufacturing costs of the sub-mount 1 and thus the semiconductor device 4. The solder wetting layer 20 can be formed by various types of film forming methods such as vacuum deposition, sputtering, ion plating, and wet plating.

Figure 13:
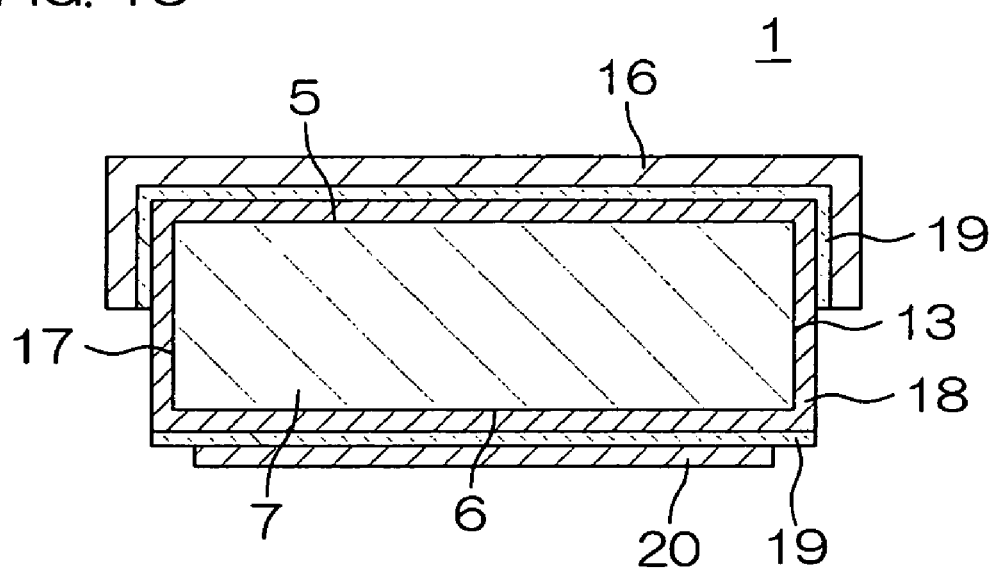
FIG. 13 is a sectional view showing still another modified example of the sub-mount.

FIG. 13 is a sectional view showing still another modified example of the sub-mount 1. Referring to FIG. 13, the sub-mount 1 in this example differs from that in the example shown in FIG. 12 in that the diffusion preventing layers 19 are selectively formed on only the whole of the element connection surface 5, the whole of the second-component connection surface 6 of the substrate 7 and respective upper regions, adjacent to the element connection surface 5, of the side surfaces 13 and 17, etc., and the diffusion preventing layers 19 on the element connection surface 5 and the side surfaces 13 and 17, etc., are coated with the element connecting layer 16, and the diffusion preventing layer 19 on the second-component connecting layer 6 is exposed in only respective regions, adjacent to the side surfaces 13 and 17, of the second-component connection surface 6, so that the regions are subjected to solder block processing. A region, other than the regions in which the diffusion preventing layer 19 is exposed, of the second-component connection surface 6 is provided with wettability with the solder by being coated with the solder wetting layer 20.

Although in the sub-mounts 1 in the examples shown in FIGS. 10 to 13, the second-component connecting layer composed of the solder for connection to the heat sink 3, previously described, may be formed on the adhesion layer 18 exposed on the second-component connection surface 6 or the surface of the solder wetting layer 20, it is preferable to coat the surface of each of the layers with paste-shaped solder or sandwich a foil-shaped solder preform between the layers at the time of connection with the heat sink 3 without forming the second-component connecting layer in order to reduce the manufacturing cost thereof.

Figure 14:
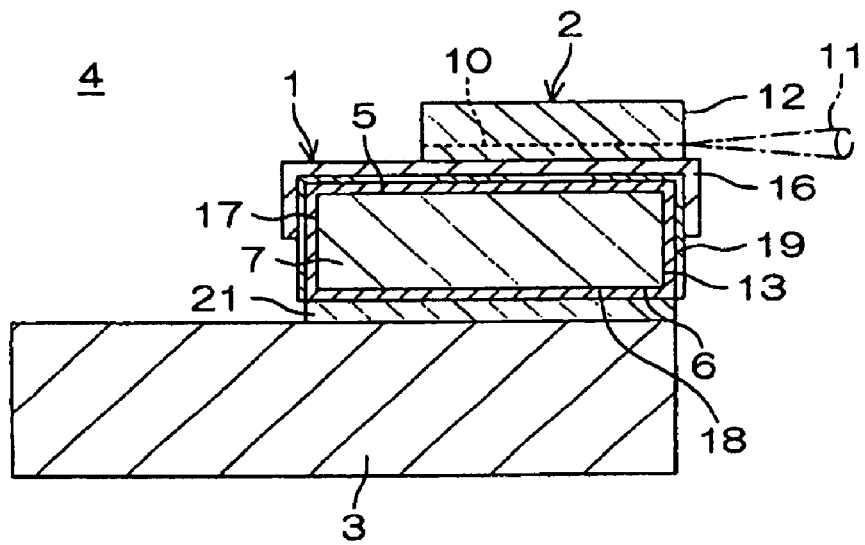
FIG. 14 is a sectional view showing an example of a semiconductor device according to the present invention, which is formed using the sub-mount shown in FIG. 11.
Figure 15:
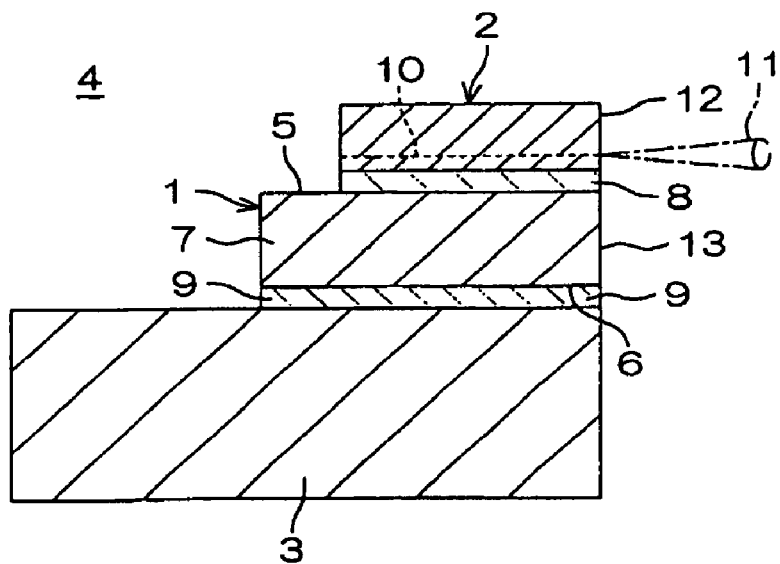
FIG. 15 is a sectional view showing an example of a conventional semiconductor device which is formed using a conventional sub-mount.

FIG. 14 is a sectional view showing an example of a semiconductor device 4 according to the present invention, which is formed using the sub-mount 1 shown in FIG. 11. That is, in the semiconductor device 4 in this example, the semiconductor laser 2 is connected to the element connection surface 5 of the substrate 7 in the sub-mount 1 through the element connecting layer 16, and the heat sink 3 is connected to the second-component connection surface 6 of the substrate 7 through a second-component connecting layer 21 composed of a solder having a melting point lower than that of a solder forming the element connecting layer 16.

In the semiconductor device 4 in the above-mentioned example, the element connecting layer 16 in the sub-mount 1 is continuously formed on not only the element connection surface 5 but also the side surfaces 13 and 17, etc. Therefore, the solder that has jutted out by being melted when the semiconductor laser 2 is connected to the sub-mount 1 can be inhibited from jutting out to the emission surface 12 of the semiconductor laser 2 by being guided so as to flow toward the side surfaces 13 and 17, etc., by the function of the element connecting layer 16, which can prevent the problems that the solder that has jutted out blocks the luminous flux of the laser light 11 emitted from the emission surface 12 and short-circuits the semiconductor laser 2.

Furthermore, the synergy between the effect produced by exposing the adhesion layer 18 on the second-component connection surface 6 of the substrate 7 to provide the second-component connection surface 6 with wettability with the solder for connection to the heat sink 3 and the effect produced by exposing the diffusion preventing layer 19 on both the side surfaces 13 and 17, etc., to perform solder block processing makes it difficult for the melted solder to jut out to the side surfaces 13 and 17 from the second-component connection surface 6 and for the solder that has jutted out to creep up along the side surfaces 13 and 17 to the vicinity of the emission surface 12 of the semiconductor laser 2 when the substrate 7 is connected to the heat sink 3. Even when as the solder, a solder superior in flowability at low temperature or a paste-shaped or foil-shaped solder is used, for example, therefore, a good solder joint having a few solder wetting defects such as a void preventing heat transfer can be obtained while inhibiting more greatly than ever before the defects that the solder that has crept up short-circuits the semiconductor laser 2 and blocks the luminous flux of the laser light emitted from the emission surface 12 of the semiconductor laser 2. Therefore, the highly-reliable semiconductor device 4 in which the various types of defects, described above, are not easy to develop can be manufactured with high yield.

As the solder for connection to the heat sink 3, forming the second-component connecting layer 21, there are suitably used a solder composed of at least one metal selected from the group consisting of In, Sn, Ag, Au, Ge, Si, Cu, Al, Bi, Sb and Zn and particularly at least one metal selected from the group consisting of In, Sn, Ag, Ge, Si, Cu, Al, Bi, Sb and Zn, having a melting point of less than 270° C., superior in flowability at low temperature, and not easily developing solder wetting defects such as a void preventing heat transfer. Examples of the solder include Sn—Ag-based, Sn—Cu-based, Sn—In-based, Sn—Ge-based, Sn—Bi-based, Sn—Sb-based, Sn—Zn-based, Sn—Ag—Cu-based, Sn—Ag—Bi-based, and Sn—Zn—Bi-based solders. The solder can be also used in states such as paste-shaped and foil-shaped states. The second-component connecting layer 21 is formed by coating the surface of the adhesion layer 18 exposed on the second-component connection surface 6 with the paste-shaped solder or sandwiching a foil-shaped solder perform between the adhesion layer 18 and the heat sink 3.

The configuration of the present invention is not limited to those in the drawings described above, and can be subjected to various changes within a range in which the scope of the present invention is not changed. Although description was made of a case where the heat spreader is the sub-mount 1, for example, in each of the above-mentioned examples, the heat spreader according to the present invention is not limited to the sub-mount 1. The configuration of the present invention is applicable to various types of heat spreaders that are each formed, in the shape of a plate, of a material containing at least a metal and interposed between the semiconductor element and the second-component to transfer heat from the semiconductor element to the second-component.

Examples of the semiconductor element that is connected to the element connection surface 5 of the sub-mount 1 to constitute the semiconductor device 4 include not only other semiconductor light emitting elements such as high-luminance light emitting diodes but also other semiconductor elements required of high heat transfer characteristics, similarly to the semiconductor light emitting elements, such as power elements, in addition to the semiconductor lasers 2 such as high-power semiconductor lasers for laser beam machining.

Examples of the second-component that is connected to the second-component connection surface 6 of the sub-mount 1 to constitute the semiconductor device 4 include various members that can constitute heat transfer systems for transferring heat transferred from the semiconductor laser 2 or the like through the sub-mount 1 into an environment, where the semiconductor device 4 is mounted, such as air. Examples of the second-component include a package, a circuit board, and a stem in addition to the heat sink 3.

EXAMPLES

Example 1

A precursor of a substrate having dimensions of 30 mm in length by 30 mm in width by 1.5 mm in thickness composed of a Cu—W composite material (Cu content: 10% by weight) having a composite structure formed by infiltrating Cu into a pore of a porous body composed of W was formed in conformity with a manufacturing method disclosed in JP 59-21032 A (1984). The precursor was subjected to planar rough grinding until the thickness thereof became 1.0 mm using a double-end grinder in which a WA grindstone of #400 was set, was then finished by wrapping processing using free alumina abrasive grains until the thickness thereof became 0.6 mm and the arithmetical mean roughness Ra of the roughness profile became 0.4 μm, was further cut, and to subject its cut surface to rough processing and finish processing by wire electric discharge machining while changing a discharge output, thereby to produce a substrate in the shape of a plate having dimensions of 2 mm in length by 10 mm in width by 0.6 mm in thickness and having an arithmetical mean roughness Ra of 0.7 μm on a side surface as the cut surface. The specific resistance of the substrate 7 was $5.3 \times 10^{-8}$ Ωm, the thermal conductivity thereof was 180 W/m·K, and the thermal expansion coefficient thereof was $6.5 \times 10^{-6}$/K.

Then, the above-mentioned substrate 7 was used to manufacture a sub-mount 1 serving as a heat spreader having a layered structure shown in FIG. 12. That is, the whole surface of the substrate 7 was coated with a Ni plating layer having a thickness of 2 μm to obtain an adhesion layer 18, and the adhesion layer 18 was coated with a Pt layer having a thickness of 0.2 μm by sputtering to obtain a diffusion preventing layer 19. Then, side surfaces 13 and 17, etc., and an element connection surface 5 of the substrate 7 were concealed with a jig, and a region having dimensions of 1.6 mm in length by 9.6 mm in width at the center of a second-component connection surface 6 was exposed. The exposed region was coated with an Au layer having a thickness of 0.1 μm by vacuum deposition with a region around the exposed region concealed with a metal mask to obtain a solder wetting layer 20.

Then, in a state where the second-component connection surface 6 of the substrate 7 and respective regions having a width of 0.3 mm in the thickness direction of the substrate 7 from edges, on the side of the second-component connection surface 6, of the side surfaces 13 and 17, etc., were concealed with a jig, to expose the element connection surface 5 and respective regions having a width of 0.3 mm in the thickness direction of the substrate from edges, on the side of the element connection surface 5, of the side surfaces 13 and 17, etc., the exposed regions were coated by vacuum deposition with an element connecting layer 16 composed of an Au—Sn solder (Sn content: 20% by weight) having a thickness of 3 μm, to manufacture the sub-mount 1 in which the diffusion preventing layer 19 is exposed as a solder block layer in respective regions, adjacent to the second-component connection surface 6, of the side surfaces 13 and 17, etc., and regions, adjacent to the side surfaces 13 and 17, etc., of the second-component connection surface 6, as shown in FIG. 12.

Measurement of Warping Amount

From the results obtained in measuring a surface shape in the diagonal direction of a plane, on the side of the element connection surface 5, of the manufactured sub-mount 1 using a surface texture measuring instrument [SURFCOM (Registered trademark) 1400D manufactured by TOKYO SEIMITSU CO., LTD.] over a length of 10 mm, the maximum height of rolling circle waviness profile $W_{EM}$ defined in JIS B 0610:2001 "Geometrical Product Specification (GPS)—Surface texture: Profile method—Definitions and designation of rolling circle waviness" was 0.35 μm when it was found as an warping amount per millimeter in length in the diagonal direction.

Example 2

A sub-mount 1 in which a diffusion preventing layer 19 is exposed as a solder block layer in only respective regions, adjacent to a second-component connection surface 6 of a substrate 7, of side surfaces 13 and 17, etc., was manufactured in the same manner as in the example 1 except that the whole of the second-component connection surface 6 was coated with an Au layer to obtain a solder wetting layer 20. The warping amount per millimeter in length in the diagonal direction of the manufactured sub-mount 1 was 0.22 μm.

Example 3

A sub-mount 1 serving as a heat spreader having a layered structure shown in FIG. 13 was manufactured using the same substrate 7 as used in the example 1. That is, the whole surface of the substrate 7 was coated with a Ni plating layer having a thickness of 2 μm, to obtain an adhesion layer 18. Then, in a state where side surfaces 13 and 17, etc., and an element connection surface 5 of the substrate 7 were concealed with a jig, and where a second-component connection surface 6 was exposed, the whole of the second-component connection surface 6 was coated with a Pt layer having a thickness of 0.2 μm by sputtering, to obtain a diffusion preventing layer 19. Then, in a state where the side surfaces 13 and 17, etc., and the element connection surface 5 of the substrate 7 were concealed with a jig, and where a region having dimensions of 1.6 mm in length by 9.6 mm in width at the center of the second-component connection surface 6 was exposed and a region around the exposed region was concealed with a metal mask, the exposed region was coated with an Au layer having a thickness of 0.1 μm by vacuum deposition, to obtain a solder wetting layer 20.

Then, in a state where the second-component connection surface 6 of the substrate 7 and respective regions having a width of 0.3 mm in the thickness direction of the substrate 7 from edges, on the side of the second-component connection surface 6, of the side surfaces 13 and 17, etc., were concealed with a jig, to expose the element connection surface 5 and respective regions having a width of 0.3 mm in the thickness direction of the substrate 7 from edges, on the side of the element connection surface 5, of the side surfaces 13 and 17, etc., the exposed regions were coated with a Pt layer having a thickness of 0.2 μm by sputtering, to obtain a diffusion preventing layer 19. Then, the exposed regions were successively coated by vacuum deposition with an element connecting layer 16 composed of an Au—Sn solder (Sn content: 20% by weight) having a thickness of 3 μm, to manufacture the sub-mount 1 in which the diffusion preventing layer 19 is exposed as a solder block layer in only a region, adjacent to the side surfaces 13 and 17, etc., of the second-component connection surface 6, as shown in FIG. 13. The warping amount per millimeter in length in the diagonal direction of the manufactured sub-mount 1 was 0.22 μm.

Example 4

A sub-mount 1 in which a diffusion preventing layer 19 was exposed as a solder block layer in only respective regions, adjacent to a second-component connection surface 6, of side surfaces 13 and 17, etc., and regions, adjacent to the side surfaces 13 and 17, etc., of the second-component connection surface 6 was manufactured in the same manner as in the example 1 except that a substrate, in the shape of a plate having dimensions of 2 mm in length by 10 mm in width by 0.6 mm in thickness and having an arithmetical mean roughness Ra of 2.0 μm on a side surface as its cut surface, produced by subjecting its precursor to planar roughness grinding, finishing by wrapping processing, and then cutting by wire electric discharge machining was used. The warping amount per millimeter in length in the diagonal direction of the manufactured sub-mount 1 was 0.22 μm.

Example 5

A sub-mount 1 in which a diffusion preventing layer 19 was exposed as a solder block layer in only respective regions, adjacent to a second-component connection surface 6, of side surfaces 13 and 17, etc., and regions, adjacent to the side surfaces 13 and 17, etc., of the second-component connection surface 6 was manufactured in the same manner as in the example 1 except that a substrate, in the shape of a plate having dimensions of 2 mm in length by 10 mm in width by 0.6 mm in thickness and having an arithmetical mean roughness Ra of 0.02 μm on a side surface as its cut surface, produced by subjecting its precursor to planar roughness grinding, finishing by wrapping processing, further cutting and then subjecting the cut surface to rough processing and finish processing by wire electric discharge machining while changing a discharge output was used. The warping amount per millimeter in length in the diagonal direction of the manufactured sub-mount 1 was 0.35 μm.

Example 6

A sub-mount 1 serving as a heat spreader having a layered structure shown in FIG. 11 was manufactured using the same substrate 7 as that used in the example 1. That is, the whole surface of the substrate 7 was coated with a Ni plating layer having a thickness of 2 μm, to obtain an adhesion layer 18. Then, in a state where a second-component connection surface 6 of the substrate 7 was concealed with a jig, and side surfaces 13 and 17, etc., and an element connection surface 5 were exposed, the whole of each of the surfaces was coated with a Pt layer having a thickness of 0.2 μm by sputtering, to obtain a diffusion preventing layer 19. Further, the adhesion layer 18 was exposed on the second-component connection surface 6, to provide the second-component connection surface 6 with wettability with a solder.

Then, in a state where the second-component connection surface 6 of the substrate 7 and respective regions having a width of 0.3 mm in the thickness direction of the substrate 7 from edges, on the side of the second-component connection surface 6, of the side surfaces 13 and 17, etc., were concealed with a jig, to expose the element connection surface 5 and regions having a width of 0.3 mm in the thickness direction of the substrate from edges, on the side of the element connection surface 5, of the side surfaces 13 and 17, etc., the exposed regions were coated with an element connecting layer 16 composed of an Au—Sn solder (Sn content: 20% by weight) having a thickness of 3 μm by vacuum deposition, to manufacture the sub-mount 1 in which the diffusion preventing layer 19 was exposed as a solder block layer in only respective regions, adjacent to the second-component connection surface 6, of the side surfaces 13 and 17, etc., as shown in FIG. 11. The warping amount per millimeter in length in the diagonal direction of the manufactured sub-mount 1 was 0.22 μm.

Comparative Example 1

A sub-mount 1 in which a diffusion preventing layer 19 was not exposed as a solder block layer on any surface in the same manner as in the example 3 except that the diffusion preventing layer 19 was not formed on a second-component connection surface 6 and a solder wetting layer 20 was formed on the whole of the second-component connection surface 6. The warping amount per millimeter in length in the diagonal direction of the manufactured sub-mount 1 was 0.22 μm.

Comparative Example 2

A sub-mount 1 in which a diffusion preventing layer 19 was not exposed as a solder block layer on any surface in the same manner as in the comparative example 1 except that a solder wetting layer 20 was not formed on a second-component connection surface 6. The warping amount per millimeter in length in the diagonal direction of the manufactured sub-mount 1 was 0.22 μm.

Manufacture of Semiconductor Device

In a state where a semiconductor laser was superimposed on an element connection surface of the sub-mount manufactured in each of the examples and the comparative examples through an element connecting layer such that its emission surface was aligned so as to be flush with one side surface of a substrate and fixed, a solder forming the element connecting layer was melted by being heated at a temperature of 300° C. for two minutes in a reducing atmosphere in which 15% by volume of H₂ was contained in N₂, and was joined to a lower surface of semiconductor laser, to connect the sub-mount and the semiconductor laser to each other.

Then, in a state where a foil-shaped solder preform having dimensions of 2 mm in length by 10 mm in width by 0.05 mm in thickness composed of a Sn—Ag—Cu solder (Ag content: 3.0% by weight, Cu content: 0.5% by weight) was sandwiched as a second-component connecting layer between the sub-mount and a heat sink made of Cu having dimensions of 15 mm in length by 25 mm in width by 3 mm in thickness, and where the sub-mount and the heat sink were aligned such that a side surface, aligned so as to be flush with the same plane of the emission surface of the semiconductor laser of the substrate and one side surface of the heat sink would be flush with each other and fixed, a solder forming the second-component connecting layer was melted by being heated at a temperature of 240° C. for three minutes in a N₂ atmosphere to respectively join the solder to a solder wetting layer provided on a lower surface of the substrate in the sub-mount and an upper surface of the heat sink to connect the sub-mount and the heat sink to each other, thereby manufacturing a semiconductor device.

Evaluation of Characteristics

When semiconductor lasers in 50 semiconductor devices manufactured for each of the sub-mounts in the examples and the comparative examples were energized, the semiconductor devices in which the semiconductor lasers could not be operated or the semiconductor devices in which the semiconductor lasers could be operated but the sectional shapes of luminous fluxes of laser light emitted from the emission surfaces of the semiconductor lasers were not a predetermined sectional shape by being blocked with the solder when observed were taken as defective products, and the ratio of the number of defective products to the total number of the semiconductor devices was calculated as a fraction defective. The results are shown in Table 1.

TABLE 1

| | Warping amount (μm/mm) | Ra on side Surface (μm) | Exposure of solder block layer | | Defective product | |
|---|---|---|---|---|---|---|
| | | | Side surface | Second-component connection surface | Number | Ratio (%) |
| Example 1 | 0.35 | 0.7 | Yes | Yes | 0 | 0 |
| Example 2 | 0.22 | 0.7 | Yes | No | 2 | 4 |
| Example 3 | 0.22 | 0.7 | No | Yes | 3 | 6 |
| Example 4 | 0.22 | 2.0 | Yes | Yes | 18 | 36 |
| Example 5 | 0.35 | 0.02 | Yes | Yes | 5 | 10 |
| Example 6 | 0.22 | 0.7 | Yes | No | 2 | 4 |
| Comparative example 1 | 0.22 | 2.0 | No | No | 41 | 82 |
| Comparative example 2 | 0.22 | 0.7 | No | No | 38 | 76 |

From the Table, in cases where the sub-mounts of the comparative examples 1 and 2 in which the diffusion preventing layer was exposed as a solder block layer on neither of the side surface nor the second-component connection surface of the substrate were used, the fraction defective was as high as 82%, so that it was found that a good solder joint that had no defects by inhibiting the solder from creeping up along the side surface could not be obtained with good yield. On the other hand, in cases where the sub-mounts of the examples 1 to 6 in each of which the diffusion preventing layer was exposed as a solder block layer on either of the side surface or the second-component connection surface of the substrate were used, the fraction defective was not more than 36%, so that it was confirmed that a good solder joint that had no defects by inhibiting the solder from creeping up along the side surface could be obtained with high yield. From the results of comparison among the examples 1 to 3 and 6, it was found that substantially the same effect was obtained whether the diffusion preventing layer was exposed on the side surface or the second-component connection surface of the substrate. From the results of comparison among the examples 1, 4, and 5, it was found that the arithmetical mean roughness Ra on the side surface of the substrate was preferably 0.1 to 1.6 µm.

Examples 7 to 12, Comparative Examples 3 and 4

A sub-mount shown in Table 2 was manufactured in the same manner as in the examples 1 to 6 and the comparative examples 1 and 2 except that as a precursor of a substrate, there was used one composed of a Cu—Mo composite material (Cu content: 15% by weight) having a composite structure formed by infiltrating Cu into a pore of a porous body composed of Mo, which was produced in conformity with a manufacturing method disclosed in JP 59-21032 A (1984), and a semiconductor device was manufactured using the sub-mount, to find a fraction defective. The results are shown in Table 2. The specific resistance of the substrate was $5.3 \times 10^{-8}$ Ωm, the thermal conductivity thereof was 160 W/m·K, and the thermal expansion coefficient thereof was $7.0 \times 10^{-6}$/K.

TABLE 2

| | Warping amount (µm/mm) | Ra on side Surface (µm) | Exposure of solder block layer | | Defective product | |
|---|---|---|---|---|---|---|
| | | | Side surface | Second-component connection surface | Number | Ratio (%) |
| Example 7 | 0.36 | 0.7 | Yes | Yes | 0 | 0 |
| Example 8 | 0.28 | 0.7 | Yes | No | 2 | 4 |
| Example 9 | 0.28 | 0.7 | No | Yes | 4 | 8 |
| Example 10 | 0.28 | 2.0 | Yes | Yes | 21 | 42 |
| Example 11 | 0.36 | 0.018 | Yes | Yes | 7 | 14 |
| Example 12 | 0.28 | 0.7 | Yes | No | 3 | 6 |
| Comparative example 3 | 0.28 | 2.0 | No | No | 45 | 90 |
| Comparative example 4 | 0.28 | 0.7 | No | No | 40 | 80 |

From the Table, in cases where the sub-mounts of the comparative examples 3 and 4 in which the diffusion preventing layer was exposed as a solder block layer on neither of the side surface nor the second-component connection surface of the substrate, the fraction defective was as high as 90%, so that it was found that a good solder joint that had no detects by inhibiting the solder from creeping up along the side surface could not be obtained with good yield. On the other hand, in cases where the sub-mounts of the examples 7 to 12 in each of which the diffusion preventing layer was exposed as a solder block layer on either of the side surface or the second-component connection surface of the substrate were used, the fraction defective was not more than 42%, so that it was confirmed that a good solder joint that had no detects by inhibiting the solder from creeping up along the side surface could be obtained with high yield. From the results of comparison among the examples 7 to 9 and 12, it was found that substantially the same effect was obtained whether the diffusion preventing layer was exposed on the side surface or the second-component connection surface of the substrate. From the results of comparison among the examples 7, 10, and 11, it was found that the arithmetical mean roughness Ra on the side surface of the substrate was preferably 0.1 to 1.6 µm.

Example 13, Comparative Example 5

A precursor of a substrate having a diameter of 50 mm and a thickness of 1.0 mm composed of a composite material (Cu content: 50% by weight) having a composite structure formed by bonding a large number of fine diamond particles to one another using Cu serving as a bonding material was formed in conformity with a manufacturing method disclosed in JP 2004-175626 A. The precursor was then subjected to planar grinding until the thickness thereof became be 0.6 mm and the arithmetical mean roughness Ra of the roughness profile became 0.5 µm using a planar grinder in which a diamond grindstone of #400 was set, was cut and then subjected to rough processing and finish processing of its cut surface by wire electric discharge machining while changing a discharge output, to produce a substrate in the shape of a plate having dimensions of 2 mm in length by 10 mm in width by 0.6 mm in thickness and having an arithmetical mean roughness Ra of 0.7 µm on a side surface as the cut surface. The specific resistance of the substrate was $2.6 \times 10^{-4}$ Ωm, the thermal conductivity thereof was 550 W/m·K, and the thermal expansion coefficient thereof was $6.0 \times 10^{-6}$/K. A sub-mount was manufactured in the same manner as in the example 1 and the comparative example 1 except that the above-described substrate was used, and a semiconductor device was manufactured using the above-described sub-mount, to find a fraction defective. The results are shown in Table 3.

Example 14, Comparative Example 6

A precursor of a substrate having dimensions of 30 mm in length by 30 mm in width by 1.5 mm in thickness composed of a composite material (Al content: 30% by weight) having a composite structure in which SiC was dispersed in a particulate shape in Al was formed in conformity with a manufacturing method disclosed in JP 10-335538 A (1998). The precursor was then subjected to planar grinding until the thickness thereof became 0.6 mm and the arithmetical mean roughness Ra of the roughness profile became 0.8 µm using a double-end grinder in which a diamond grindstone of #800 was set, was cut and then subjected to rough processing and finish processing of its cut surface by wire electric discharge machining while changing a discharge output, to produce a substrate in the shape of a plate having dimensions of 2 mm in length by 10 mm in width by 0.6 mm in thickness and having an arithmetical mean roughness Ra of 1.0 µm on a side surface as the cut surface. The specific resistance of the substrate was $2.0 \times 10^{-8}$ Ωm, the thermal conductivity thereof was 150 W/m·K, and the thermal expansion coefficient thereof was $8.0 \times 10^{-6}$/K. A sub-mount was manufactured in the same manner as in the example 1 and the comparative example 1 except that the above-described substrate was used, and a semiconductor device was manufactured using the above-described sub-mount, to find a fraction defective. The results are shown in Table 3.

Example 15, Comparative Example 7

A precursor of a substrate having dimensions of 30 mm in length by 30 mm in width by 0.6 mm in thickness composed of a cladding material having a Cu layer, a Cu—Mo composite material layer (Cu content: 40% by weight) having a composite structure formed by infiltrating Cu into a pore of a porous body composed of Mo, and a Cu layer laminated in this order was formed in conformity with a manufacturing method disclosed in JP 06-268117 A (1994). The precursor was then subjected to punching processing in the shape of a plane having dimensions of 3 mm in length by 11 mm in width, and its side surface was then ground using a WA grindstone of #400, to produce a substrate in the shape of a plate having dimensions of 2 mm in length by 10 mm in width by 0.6 mm in thickness and having an arithmetical mean roughness Ra of 0.6 µm on the side surface. The specific resistance of the substrate was $4.0 \times 10^{-8}$ Ωm, the thermal conductivity thereof was 220 W/m·K, and the thermal expansion coefficient thereof was $8.3 \times 10^{-6}$/K. A sub-mount was manufactured in the same manner as in the example 1 and the comparative example 1 except that the above-described substrate was used, and a semiconductor device was manufactured using the above-described sub-mount, to find a fraction defective. The results are shown in Table 3.

TABLE 3

| | Warping amount (µm/mm) | Ra on side Surface (µm) | Exposure of solder block layer | | Defective product | |
|---|---|---|---|---|---|---|
| | | | Side surface | Second-component connection surface | Number | Ratio (%) |
| Example 13 | 0.43 | 0.7 | Yes | Yes | 0 | 0 |
| Comparative example 5 | 0.43 | 0.7 | No | No | 43 | 86 |
| Example 14 | 0.41 | 1.0 | Yes | Yes | 0 | 0 |
| Comparative example 6 | 0.41 | 1.0 | No | No | 48 | 96 |
| Example 15 | 0.54 | 0.6 | Yes | Yes | 0 | 0 |
| Comparative example 7 | 0.54 | 0.6 | No | No | 39 | 78 |

From the results of the examples and the comparative examples in the Table, even in a case where the precursor of the substrate composed of each of various types of materials was used, it was confirmed that exposing the diffusion preventing layer as a solder block layer on the side surface and the second-component connection surface of the substrate can inhibit the solder from creeping up along the side surface, to be able to obtain a good solder joint having no defects.

This application corresponds to Japanese Patent Application No. 2006-355731 filed on Dec. 28, 2006 with the Japan Patent Office, the disclosure of which is incorporated here by reference.

What is claimed is:

1. A heat spreader comprising:
a plate shaped substrate made of a material containing at least a metal and in which one surface is defined as an element connection surface for connecting a semiconductor element and an opposite surface is defined as a second-component connection surface for connecting a second-component, wherein
the second-component connection surface of the substrate is provided with wettability with a solder, and
at least one region selected from the group consisting of at least a part of a side surface crossing the element connection surface and the second-component connection surface of the substrate and a region adjacent to the side surface of the second-component connection surface is subjected to solder block processing for preventing the solder from flowing.

2. The heat spreader according to claim 1, wherein at least one region selected from the group consisting of at least a part of the side surface and the region adjacent to the side surface of the second-component connection surface is subjected to solder block processing by coating with a solder block layer composed of at least one metal selected from the group consisting of Pt, Mo, Pd, Cr and Al or a compound containing at least one of the metals.

3. The heat spreader according to claim 1, wherein at least a part of the element connection surface is coated with an element connecting layer composed of a solder.

4. The heat spreader according to claim 3, wherein a region adjacent to at least the element connection surface of the side surface is coated with the element connecting layer.

5. The heat spreader according to claim 1, wherein an arithmetical mean roughness Ra of the roughness profile representing a surface roughness of the side surface of the substrate is 0.1 to 1.6 µm.

6. The heat spreader according to claim 1, wherein a specific resistance of the substrate is $1.6 \times 10^{-8}$ to $1.0 \times 10^{-3}$ Ωm.

7. The heat spreader according to claim 1, wherein a thermal conductivity of the substrate is 150 to 650 W/m·K, and a thermal expansion coefficient thereof is $2.0 \times 10^{-6}$ to $10 \times 10^{-6}$/K.

8. The heat spreader according to claim 1, wherein the substrate is composed of a mixture of
at least one substance selected from the group consisting of W, Mo, SiC and diamond, and
at least one substance selected from the group consisting of Cu, Al and Ag.

9. The heat spreader according to claim 1, wherein the element connection surface, the second-component connection surface and the side surface of the substrate are coated with an adhesion layer composed of Ni or a compound containing Ni, and the adhesion layer is exposed on the second-component connection surface so that the second-component connection surface is provided with wettability with the solder.

10. The heat spreader according to claim 1, wherein the element connection surface, the second-component connection surface and the side surface of the substrate are coated with an adhesion layer composed of at least one metal selected from the group consisting of Ni, Ti, Cr and Cu or a compound containing at least one type of the metals and a diffusion preventing layer composed of at least one metal selected from the group consisting of Pt, Mo and Pd or a compound containing at least one of the metals in this order and the diffusion preventing layer is exposed as the solder block layer in at least one region selected from the group consisting of a region adjacent to at least the second-component connection surface of the side surface and a region adjacent to the side surface of the second-component connection surface so that the region is subjected to the solder block processing.

11. The heat spreader according to claim 10, wherein a region other than the region in which the diffusion preventing layer is exposed of the second-component connection surface is coated with a solder wetting layer composed of at least one metal selected from the group consisting of Au, Ni and Ag or a compound containing at least one of the metals so that the second-component connection surface is provided with wettability with the solder.

12. A semiconductor device, wherein a semiconductor element is connected to the element connection surface of the substrate in the heat spreader according to claim 1 through an element connecting layer composed of a solder, and a second-component is connected to the second-component connection surface through a second-component connecting layer composed of a solder having a melting point lower than that of the solder forming the element connecting layer.

13. The semiconductor device according to claim 12, wherein the solder forming the element connecting layer is an Au—Sn-based or Au—Ge-based solder.

14. The semiconductor device according to claim 12, wherein the solder forming the second-component connecting layer is a Sn—Ag-based, Sn—Cu-based, Sn—In-based, Sn—Ge-based, Sn—Bi-based, Sn—Sb-based, Sn—Zn-based, Sn—Ag—Cu-based, Sn—Ag—Bi-based or Sn—Zn—Bi-based solder.

15. The semiconductor device according to claim 12, wherein the semiconductor element is a semiconductor light emitting element.

16. The semiconductor device according to claim 12, wherein the second-component is at least one type selected from the group consisting of a heat sink, a package, a circuit board, and a stem.

* * * * *